United States Patent [19]
Oberlander

[11] Patent Number: 5,936,071
[45] Date of Patent: Aug. 10, 1999

[54] PROCESS FOR MAKING A PHOTOACTIVE COMPOUND AND PHOTORESIST THEREFROM

[75] Inventor: Joseph E. Oberlander, Phillipsburg, N.J.

[73] Assignee: Clariant Finance (BVI) Limited, Virgin Islands (Br.)

[21] Appl. No.: 09/017,446

[22] Filed: Feb. 2, 1998

[51] Int. Cl.[6] .................... C07C 309/76; C07C 303/28; G03F 7/22
[52] U.S. Cl. .......................................................... 534/557
[58] Field of Search ............................................ 534/557

[56] References Cited

U.S. PATENT DOCUMENTS

| | | | |
|---|---|---|---|
| 2,929,808 | 3/1960 | Ross et al. | 526/70 |
| 3,666,473 | 5/1972 | Colom et al. | 430/192 |
| 4,033,909 | 7/1977 | Papa | 521/131 |
| 4,033,910 | 7/1977 | Papa | 521/131 |
| 4,115,128 | 9/1978 | Kita | 430/191 |
| 4,173,470 | 11/1979 | Fahrenholtz et al. | 430/5 |
| 4,195,138 | 3/1980 | Ward | 525/404 |
| 4,250,031 | 2/1981 | Uejima et al. | 210/688 |
| 4,452,883 | 6/1984 | Frenchik et al. | 430/502 |
| 4,567,130 | 1/1986 | Held | 430/294 |
| 4,584,261 | 4/1986 | Held | 430/294 |
| 4,588,670 | 5/1986 | Kelly et al. | 430/165 |
| 4,636,540 | 1/1987 | Warfel | 523/310 |
| 4,721,665 | 1/1988 | Dooley et al. | 430/270 X |
| 4,747,954 | 5/1988 | Vaughn et al. | 210/670 |
| 4,784,937 | 11/1988 | Tanaka et al. | 430/331 |
| 4,833,067 | 5/1989 | Tanaka et al. | 430/331 |
| 4,853,315 | 8/1989 | McKean et al. | 430/192 |
| 4,914,006 | 4/1990 | Kato et al. | 430/331 |
| 5,073,622 | 12/1991 | Wojtech et al. | 528/486 |
| 5,116,715 | 5/1992 | Roland | 430/190 |
| 5,118,787 | 6/1992 | Furuno | 528/482 |
| 5,175,078 | 12/1992 | Aoyama et al. | 430/331 |
| 5,212,044 | 5/1993 | Liang et al. | 430/270 X |
| 5,284,930 | 2/1994 | Matsumoto et al. | 528/482 |
| 5,286,606 | 2/1994 | Rahman et al. | 430/311 |
| 5,300,396 | 4/1994 | Khanna et al. | 430/169 |
| 5,300,628 | 4/1994 | Honda | 528/482 |
| 5,350,714 | 9/1994 | Trefonas, III et al. | 210/663 X |
| 5,378,802 | 1/1995 | Honda | 210/660 X |
| 5,446,125 | 8/1995 | Honda et al. | 528/486 |
| 5,472,616 | 12/1995 | Szmanda et al. | 210/683 |
| 5,476,750 | 12/1995 | Rahman et al. | 430/270 |
| 5,500,127 | 3/1996 | Carey et al. | 210/685 |
| 5,501,936 | 3/1996 | Hosoda et al. | 430/191 |
| 5,516,886 | 5/1996 | Rahman et al. | 528/482 |
| 5,521,052 | 5/1996 | Rahman et al. | 430/270.1 |
| 5,532,107 | 7/1996 | Oie et al. | 430/192 |
| 5,541,033 | 7/1996 | Blakeney et al. | 430/192 |
| 5,543,263 | 8/1996 | Rahman et al. | 430/168 |
| 5,665,517 | 9/1997 | Rahman et al. | 430/270.1 |

FOREIGN PATENT DOCUMENTS

| | | |
|---|---|---|
| 544324 | 6/1993 | European Pat. Off. . |
| 544325 | 6/1993 | European Pat. Off. . |
| 0588492 | 3/1994 | European Pat. Off. . |
| 1072155 | 3/1989 | Japan . |
| 1-228560 | 9/1989 | Japan . |
| 4-65415 | 3/1992 | Japan . |
| 1509354 | 5/1978 | United Kingdom . |
| 90/01726 | 2/1990 | WIPO . |
| 93/12152 | 6/1993 | WIPO . |
| 93/18437 | 9/1993 | WIPO . |
| 94/01807 | 1/1994 | WIPO . |
| 94/12912 | 6/1994 | WIPO . |
| 94/14858 | 7/1994 | WIPO . |
| 94/14863 | 7/1994 | WIPO . |
| 96/06121 | 2/1996 | WIPO . |
| 96/12214 | 4/1996 | WIPO . |
| 96/20965 | 7/1996 | WIPO . |
| 96/21175 | 7/1996 | WIPO . |
| 96/21176 | 7/1996 | WIPO . |
| 97/11929 | 4/1997 | WIPO . |
| 97/12280 | 4/1997 | WIPO . |
| 97/12281 | 4/1997 | WIPO . |
| 97/19969 | 6/1997 | WIPO . |
| 97/25359 | 7/1997 | WIPO . |
| 97/46915 | 12/1997 | WIPO . |
| 98/27461 | 6/1998 | WIPO . |
| 98/27462 | 6/1998 | WIPO . |

OTHER PUBLICATIONS

Bayard; "Water Free of Heavy Metals for Medical Use and Ion Exchange Resin Used in its Preparation" Nov. 16, 1992; CA98(26):221589z.

Hirai et al; "Treatment of Waste Waters Containing Formaldehyde and Metals with Chelating Ion Exchange Resins"; Nov. 5, 1975; CA84(14):95328j.

Kimura et al; "Purification of Formaldehyde"; Mar. 9, 1977; CA87(7):52776y.

T. Tanada; "A New Photolithography Tech. with Antireflective . . . "; Journal of the Electrochemical Society, vol. 137, No. 12, pp. 393900–3905; Dec. 1990, Manchester, New Hampshire.

Rohm and Has Company; "Amberlite Ion Exchange Resins Laboratory Guide"; Sep. 1979; Philadelphia, PA.

JP–A–1190713 Inatomi, Shigeki et al, Jul. 31, 1989; Chemcial Abstracts, vol. 112, No. 18, Apr. 30, 1990, Columbus, OH, p. 17, the Abstract 159201u.

G. Noti et al, "Deionized Water Plants for Semiconductor Device Fabrication", Proceedings of the Inst:Radio and Electronic Eng., Australia, vol. 34, No. 2, Mar. 1973, pp. 45–51.

Derwent Publications Ltd., London, GB; JP–A–05 234 876 (OCG Microelectronic Materials), Sep. 10, 1993.

A. Knop & W. Scheib Chemistry & Application of Phenolic Resins, Chapter 4, Apr. 12, 1996.

J. Kosar, "Light Sensitive Systems", Chapter 7.4, Apr. 12, 1996.

U.S. application No. 08/813,167, filed Mar. 7, 1997.
U.S. application No. 08/812,542, filed Mar. 7, 1997.

*Primary Examiner*—Fiona T. Powers
*Attorney, Agent, or Firm*—Sangya Jain

[57] ABSTRACT

The present invention provides for process of preparing a photoactive ester compound of high purity using a solid base catalyst, preferably an anionic exchange resin. The invention further provides for preparing and imaging a photosensitive composition comprising such a photoactive compound, a film-forming resin and a solvent composition.

17 Claims, No Drawings

5,936,071

PROCESS FOR MAKING A PHOTOACTIVE COMPOUND AND PHOTORESIST THEREFROM

BACKGROUND

Photoresists are materials which change their solubility in a developer solution after the photoresist has been exposed to actinic radiation, such as to ultraviolet, electron or ion beam, laser or X-ray radiation. Photoresist compositions comprise a photoactive compound, a film forming polymeric resin and a solvent. The photoresist composition is applied to a substrate which is to be patterned and the solvent is then removed, as with heat, leaving the photoresist is a thin film covering the substrate. As a consequence of the exposure to radiation of the photoresist, a different solubility rate results between the exposed and unexposed (masked over) portions of the photoresist film which yields a surface relief pattern after development. Those photoresists which become more soluble in a developer solution in the exposed regions are referred to as "positive" photoresists. Those which become less soluble in the exposed regions are referred to as "negative" photoresists. The present invention deals with a class of those photoactive compounds suitable for use in photoresist compositions.

Positive photoresist films may comprise an aqueous alkali soluble resin, such as a novolak resin or a poly(hydroxystyrene), and a photoactive compound. It is known to the skilled artisan to produce positive photoresist compositions such as those described in U.S. Pat. Nos. 3,666,473, 4,115,128 and 4,173,470. These include water insoluble, aqueous alkali-soluble phenol-formaldehyde novolak resins together with light-sensitive materials, usually a substituted naphthoquinone diazide compound. The resin and photoactive compound are applied, such as by spin coating, spray coating, or other suitable means, from an organic solvent or solvent mixture onto a substrate, such as a silicon wafer or a chrome-plated glass plate. The developer used to process the positive photoresists are aqueous alkaline solutions, such as sodium metasilicate, potassium hydroxide, tetramethyl ammonium hydroxide and ammonium hydroxide. The developer removes the areas of the coated photoresist film that have been exposed to light or other form of irradiation so as to produce a relief pattern in the photoresist film.

The application of a photosensitive film to various substrates is an essential step in the fabrication of integrated circuits. The substrates are generally silicon wafers which may have a thin oxide coating or other coating such as silicon nitride or aluminum. The photosensitive film is used to pattern the substrate in a series of steps including exposure (through a mask pattern), development to yield a relief pattern in the photoresist layer and a substrate etch step to transfer that pattern into the substrate material. It is essential that the mask pattern be accurately reproduced in the substrate etch pattern. To achieve this high degree of accuracy, the mask pattern must be well resolved by the photoresist layer. The characteristics of the photoresist compositions, which are important in commercial practice, include its photospeed, contrast, resolution (edge acuity), thermal stability of the image during processing, processing latitude, line width control, clean development and unexposed film loss.

Not only is the performance of the photoresist critical, but also its quality, specifically, purity and consistency. Both soluble and insoluble impurities lead to yield losses during the manufacture of integrated circuits. Some of these impurities originate from the synthesis of the photoactive compound. The synthesis of the photoactive compound, typically those that are formed by an esterification reaction between a hydroxy containing compound and a halide containing compound, require a basic component to drive the esterification reaction. It is well known in the art to use soluble organic amines, such as 1,4 diazabicyclo [2,2,2] octane, N-methyl morpholine, triethyl amine or diethanolamine to drive the reaction between phenolics and diazonaphthoquinone sulfonyl chlorides, in the presence of a solvent. In order to obtain high degrees of esterification, which are desired for high resolution photoresists, greater than equimolar quantities of the amine are used. These amines form salts, and most often, chloride salts, that are difficult to remove and can lead to insoluble particles in the photoresist film. This patent discloses a method of making photoactive compounds that requires little or no soluble organic amines and furthermore can provide photoresist films with low levels of impurities, especially chloride.

SUMMARY

The invention provides a process for producing photoactive ester compounds of high purity comprising, reacting a compound containing at least one hydroxy group with a compound containing at least one halide group in the presence of a solid basic catalyst and in a solvent medium. The solid basic catalyst may be an anionic exchange resin. In one preferred embodiment less than equimolar amount of soluble organic amine is added to the reaction mixture, preferably less than 0.3 equivalent of the amine and more preferably less than 0.2 equivalent of the amine of the chloride concentration. The concentration of chloride contamination in the photoactive compound made according to the invention is preferably less than 100 ppm, more preferably less than 50 ppm, even more preferably less than 25 ppm, and most preferably less than 10 ppm. The photoactive compound is preferably a reaction between a multihydroxy phenolic compound and a diazonaphthoquinone sulfonyl chloride.

The invention also relates to a process for making a photosensitive composition comprising a film-forming resin, a solvent and a photoactive compound of high purity produced by reacting a compound containing at least one hydroxy group with a compound containing at least one halide group in the presence of a solid basic catalyst and in a solvent medium. The invention further relates to a process for forming an image on a substrate using such a photosensitive composition.

DESCRIPTION

The present invention relates to a process for producing a photoactive ester compound, comprising reacting a compound containing at least one hydroxy group with a compound containing at least one halide group in the presence of a solid basic catalyst and in a solvent medium. The invention also relates to a process for making and further imaging a photosensitive composition comprising a film-forming resin, a photoactive ester compound produced by reacting a compound containing at least one hydroxy group with a compound containing at least one halide group in the presence of a solid basic catalyst and in a solvent medium. In cases where high conversions are required, additional organic soluble amine may be present in the reaction mixture at a concentration less than 0.3 equivalent.

A photosensitive composition typically comprises an alkali-soluble, film-forming resin, a photoactive compound and a solvent. Resins used in photosensitive compositions may be novolak polymers or poly(hydroxystyrene) polymers. Novolak resins have been commonly used in the art of photoresist manufacture as exemplified by "*Chemistry and Application of Phenolic Resins*", Knop A. and Scheib, W.; Springer Verlag, New York, 1979 in Chapter 4. Similarly, photoactive compounds, such as, oquinone diazides are well known to the skilled artisan as demonstrated by "*Light Sensitive System*", Kosar, J.; John Wiley & Sons, New York, 1965 in Chapter 7.4. Typically, photosensitive diazides used in positive photoresists, are obtained by reacting hydroxyl containing compounds, known as ballast compounds, with 2,1-diazonaphthoquinone sulfonyl chlorides. Such ballast compounds are well known in the art, and examples of which are disclosed in U.S. Pat. Nos. 4,588,670, 4,853,315, 5,501,936, 5,532,107 and 5,541,033, and are incorporated herein by reference. The esterification reaction between the hydroxyl compound and the 2,1-diazonaphthoquinone sulfonyl chloride requires a base to drive the reaction. In order to avoid metal impurities in the photoactive compound, organic amines instead of metal carbonates, are currently being used as a base to catalyse the esterification reaction. The art discloses the use of amines soluble in organic solvents, such as -1,4 diazabicyclo [2,2,2] octane, N-methyl morpholine, triethyl amine and diethanolamine. However, it has been found that significant quantities, that is noncatalytic amounts, of the amine need to be used in the reaction. It is believed, although the applicants do not wish to be bound by the theory, that the amine reacts with the chloride resulting from the esterification reaction to form the chloride salt and thus the amine is consumed and is not regenerated to act as a catalyst. Therefore, at least an equimolar amount of amine must be used when reacting a hydroxyl containing compound with a chloride containing compound. However, when high degrees of esterification are required, that is, typically when greater than 60% of the hydroxyl groups are reacted with the 2,1-diazonaphthoquinone sulfonyl chloride, then significant amounts of the aminochloride is formed and this leads to unacceptably high levels of chloride in the photoresist films. Photoactive compounds with higher degrees of esterification are often desirable since they are known to give photoresists with better resolution. The salt formed must be removed from the reaction product, since it is known that these types of salts can cause contamination problems in the photoresist film. These salts are removed typically, by washing the photoactive compound with an aqueous solution, and often repeated washings are necessary to reduce the salt concentration. Despite these washings, chloride levels are not reduced to the levels desired by the industry of less than 100 ppm, preferably less than 50 ppm and preferably less than 10 ppm, in the photoresist film. Residual free amine can also hinder the photolytic mechanism of the photoactive compound in the photoresist film. Thus, there is great need to reduce or eliminate organic soluble amines from the synthesis of the photoactive compound.

The present invention discloses a method of esterification to form an ester photoactive compound, where a solid basic resin; for example, an anionic exchange resin, that does not dissolve in the reaction medium, is used as a insoluble base for catalysing the reaction between a hydroxy containing compound and a halide containing compound. The solid basic resin provides the basic site for catalyzing the esterification reaction, and furthermore, it has been found that the chloride levels are also reduced when using the solid catalyst. Once the reaction is complete the solid resin is removed, preferably filtered, and almost all of the halide can be removed from the photoactive compound. Thus, this invention describes a unique way of using the anion exchange resin for both providing a basic reaction site to drive the esterification reaction and also a process for reducing the contaminant levels in the photoactive compound. This results in a cost effective method for both the synthesis of the photoactive compound and also the removal of the possible sources of contaminants in the esterification product.

In another embodiment of the invention a combination of a small amount of an organic amine soluble in the organic solvent composition of the reaction, and a solid basic catalyst; for example, an anionic exchange resin, is added to the solution of the reactants. Examples of such organic amines, without limitation are, 1,4 diazabicyclo [2,2,2] octane, N-methyl morpholine, triethyl amine or diethanolamine. This novel process helps achieves a high degree of esterification without excessive amounts of the amine salt being formed. The amine may be used at concentrations of less than 0.3 equivalent, preferably less than 0.2 equivalent, relative to the chloride functionality. The amount of the solid basic catalyst used depends on the composition of the reactants, type of solvent(s) and degree of esterification.

The photoactive compounds of this invention are prepared by a process of esterification of the hydroxy compound with the diazo compound. The ballast compound can contain one or more hydroxy groups, preferably these hydroxy groups are attached to a phenyl moeity, although an aliphatic moeity is within the scope of this invention. Examples of such compounds are, without limitation, 2,3,4 trihydroxybenzophenone, 2,3,4,4' tetrahydroxybenzophenone, cumyl phenone, trishydroxyphenylalkane, oligomers of substituted phenols and formaldehyde, 4,8, dihydroxymethyl tricyclo(5.2.1.0) decane, and others known in the art.

2,1-diazonaphthoquinone sulfonyl chlorides are commonly used, specific examples of which are, 2,1,5-diazonaphthoquinone sulfonyl chlorides, 2,1,4-diazonaphthoquinone sulfonyl chlorides, 2,1,6-diazonaphthoquinone sulfonyl chlorides and mixtures of these may also be used. Other diazo chlorides may also be used, such as those described in U.S. Ser. No. 08/813,167 filed Mar. 7, 1997, and Ser. No. 08/812,542 filed Mar. 7, 1997, and referenced herein, examples of which are, 3,diazo, 2,4-quinoline sulfonyl chloride and 3,diazo,4-oxo coumarin sulfonyl chloride, etc.

It is also within the scope of this invention that a photoactive ester compound is formed by the reaction of a 2,1-diazonaphthoquinone acid and a ballast compound containing at least one halide group. This esterification reaction can be carried in a solvent medium and in the presence of a solid basic catalyst as described previously, and optionally, with a less than 0.3 equivalent of a organic soluble amine.

The esterification reaction is carried out in an organic solvent medium. Solvents that may be used are those that dissolve the reactants, organic amine and other components, except the solid ion exchange catalyst. Examples of such solvents are, but are not limited to, butyrolactone, acetone, propylene glycol monomethyl ether, dioxane, tetrahydrofuran, or mixtures thereof.

An example of a solid basic catalyst is an anionic exchange resin, which can be obtained commercially such as Amberlyst® 21 or Amberlyst® 26. These resins should be of sufficient purity so that contaminants, largely ionic, are not reintroduced into the reaction mixture. Sometimes it is necessary to treat the ion exchange resins to remove almost all of the impurities, through several aqueous and/or solvent washing steps. The ion exchange resin may be treated as described in the prior art referenced herein, U.S. Pat. No. 5,543,263 and U.S. Ser. No. 294,453. The solid resin is added in amounts sufficient to effectively catalyze the reaction and remove the halide, preferably one to three times the concentration of the halide, more preferably one to two times the concentration of the halide. Furthermore, it has been found that use of the solid anionic catalyst reduces the ionic impurities compared to cases where it is not used.

The reaction conditions, such as temperature, time and concentration of the components, are adjusted to give the photoactive product with the desired degree of esterification and purity. The temperature is generally kept below 45° C., preferably below 30° C. Upon completion of the esterification reaction, the solid catalyst is filtered and the esterification product is washed and dried under vacuum, preferably at 35–40° C. Optionally, an acid may be added after removing the solid catalyst, either in the form of a solvent soluble acid, such as glacial acetic acid, or a solid cationic exchange resin, such as Amberlyst® 15, to quench the reaction. The treatment with the solid cationic exchange resin provides a further advantage in that it can then be completely removed by a simple process of filtration.

Once the photoactive ester has been formed, it can be isolated by any of the known methods, such as precipitating from a cold aqueous methanol solution. The photoactive ester can further be washed with water and dried, thereby giving a photoactive compound of high purity that can be formulated into a photoresist.

The novel photosensitive composition of this invention is formulated by forming an admixture of a film-forming resin, the photoactive compound of high purity according to the method described in this invention and a photoresist solvent composition. Film-forming resins can be novolak resins, polyhydroxystyrenes, and others known in the art.

Suitable solvents for photosensitive compositions may include propylene glycol mono-alkyl ether, propylene glycol alkyl (e.g. methyl) ether acetate, ethyl-3-ethoxypropionate, ethyl lactate, mixtures of ethyl-3-ethoxypropionate and ethyl lactate, 2-heptanone, 3-methoxy-3-methyl butanol, butyl acetate, anisole, xylene, diglyme, ethylene glycol monoethyl ether acetate or mixtures thereof. The preferred solvents are propylene glycol methyl ether acetate (PGMEA), ethyl lactate, 2-heptanone, anisole, ethyl-3-ethoxypropionate (EEP) and 3-methoxy-3-methyl butanol.

In the preferred embodiment, the solid parts of the photoresist composition, the novolak resin and the diazonaphthoquinone, preferably range from 15% to about 99% resin with from about 1% to about 85% diazonaphthoquinone. A more preferred range of resin would be from about 50% to about 90% and most preferably from about 65% to about 85% by weight of the solids photoresist components. A more preferred range of the diazonaphthoquinone would be from about 10% to about 50% and most preferably from about 15% to about 35%, by weight of the solid in the photoresist. In manufacturing the photoresist composition, the resin and the diazonaphthoquinone are mixed with the solvent, such that the solvent mixture is present in an amount of from about 40% to about 90% by weight of the overall photoresist composition. A more preferred range is from about 60% to about 83% and most preferably from about 65% to about 70% by weight of the overall photoresist composition.

Additives such as colorants, non-actinic dyes, anti-striation agents, plasticizers, adhesion promoters, coating aids, speed enhancers and surfactants may be added to the solution of resin, photoactive compound and solvent system before the solution is coated onto a substrate.

The prepared photoresist solution, can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist coatings produced by the described procedure are particularly suitable for application to thermally grown silicon/silicon dioxide-coated wafers, such as are utilized in the production of microprocessors and other miniaturized integrated circuit components. An aluminum/aluminum oxide wafer can also be used. The substrate may also comprise various polymeric resins, especially transparent polymers such as polyesters. The substrate may have an adhesion promoted layer of a suitable composition, such as one containing hexa-alkyl disilazane.

The photoresist composition solution is then coated onto the substrate, and the substrate is treated at a temperature from about 70° C. to about 110° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature ranges from about 85° C. to about 95° C. The treatment is conducted until the rate of change of solvent removal becomes relatively insignificant. The temperature and time selection depends on the photoresist properties desired by the user, as well as the equipment used and commercially desired coating times. The coated substrate can then be exposed to actinic radiation, e.g., ultraviolet radiation, at a wavelength of from about 300 nm to about 450 nm, x-ray, electron beam, ion beam or laser radiation, in any desired pattern, produced by use of suitable masks, negatives, stencils, templates, etc.

The photoresist is then optionally subjected to a post exposure second baking or heat treatment either before or after development. The heating temperatures may range from about 90° C. to about 120° C., more preferably from about 100° C. to about 110° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas by immersion in an alkaline developing solution or developed by spray development process. The solution is preferably agitated, for example, by nitrogen burst agitation. The substrates are allowed to remain in the developer until all, or substantially all, of the photoresist coating has dissolved from the exposed areas. Developers may include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The photoresist compositions of the present invention are resistant to acid-base etching solutions and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

Cleaning of Amberlyst® 21

The anionic ion exchange resin, Amberlyst® 21, was soaked for 2 hours and was cleaned by passing deionized water through a column of Amberlyst® 21 until the effluent was clear, followed by 10% ammonium hydroxide and further rinsed until the deionized water passing through the column was neutral. This cleaned Amberlyst® 21 was dried for use in the following Examples.

Cleaning of Amberlyst® 15

Amberlyst 15 beads (100 ml) as received were soaked for 2 hours in 500 ml of deionized water (DI) water. After the 2 hour soaking the beads were placed in a glass column. DI water was passed through the column until the effluents ran clear. Six bed volumes of 10% (electronic grade) hydrochloric acid were passed through the column with a 10 minutes residence time for each bed volume. Finally a large volume of DI water was passed through the column until the conductivity of the water going into the column was the same as the effluents leaving the column. At this point the beads were considered ready for use and dried.

Example 1

A mixture of tris-(4-hydroxyphenyl)ethane (THPE) (13.5 g, 0.044 moles), 2,1,4-diazo naphthoquinone sulfonyl chloride (14.9 g, 0.055 moles), 2,1,5-diazo naphthoquinone sulfonyl chloride (20.3 g, 0.075 moles), gamma-butyrolactone (200 ml) and acetone (100 ml) was stirred gently at 25° C. until about 90% of the starting materials were in solution. To this mixture was added, over 15 minutes, a solution of 1,4-diazabicyclo(2,2,2-)octane (Dabco) (2 g, 0.018 moles and 0.14 equivalent of chloride), gamma-butyrolactone (60 ml) and acetone (30 ml). A cleaned Amberlyst® 21 resin (65 g) was then added over one hour, while keeping the reaction temperature below 30° C. The reaction mixture was stirred for one hour. The Amberlyst® 21 resin was filtered. Glacial acetic acid (2 ml) was added and stirred for one hour. The final solution was filtered and added to a mixture of deionized (DI) water (800 ml) and methanol (200 ml), maintained at 15–20° C., while stirring. The slurry was stirred for 30 minutes and filtered. The product was dried and washed with DI water until the conductivity of the wash liquor was less than 1 $\mu$Siemens ($\mu$LS). The compound was dried in a vacuum oven at 35–40° C. until the water content was less than 1%. The degree of esterification, that is, the amount of hydroxy groups that reacted with the chloride to form the ester, was determined by high pressure liquid chromatography to be 85% and the total chloride level as measured by silver nitrate assay was less than 10 ppm.

Example 2 (Comparative)

A mixture of tris-(4-hydroxyphenyl)ethane (THPE) (6.2 Kg, 20.2 moles), 2,1,4-diazo naphthoquinone sulfonyl chloride (36.8 Kg, 25.2 moles), 2,1,5-diazo naphthoquinone sulfonyl chloride (10.1 Kg, 37.5 moles), gamma-butyrolactone (27.1 l) and acetone (13.7 l) was stirred gently at 25° C until about 90% of the starting materials were in solution. To this mixture was added, over 30–40 minutes, a solution of 1,4-diazabicyclo(2,2,2-)octane (Dabco) (7.4 Kg, 66.1 moles), gamma-butyrolactone (24.3 l) and acetone 12.1 l). The mixture was stirred for an hour and the temperature maintained at 30° C. The final solution was filtered. Glacial acetic acid (3.2 Kg) was added and stirred for one hour. The acidified solution was filtered. The solution was added to a mixture of deionized (DI) water (756 l) and methanol (81 l), maintained at 15–20° C., while stirring. The slurry was stirred for 30 minutes and filtered. The product was dried and washed with DI water until the conductivity of the wash liquor was between 3–5 $\mu$S. The compound was dried in a vacuum oven at 35–40° C. until the water content was less than 1%. The degree of esterification was determined by high pressure liquid chromatography to be 99% and the total chloride level as measured by silver nitrate assay was 170 ppm.

Example 3

A mixture of tris-(4-hydroxyphenyl)ethane (THPE) (13.5 g, 0.044 moles), 2,1,4-diazo naphthoquinone sulfonyl chloride (14.9 g, 0.055 moles), 2,1,5-diazo naphthoquinone sulfonyl chloride (20.3 g, 0.075 moles), gammabutyrolactone (90 ml) and acetone (45 ml) was stirred gently at 25° C. until about 90% of the starting materials were in solution. A washed Amberlyst® 21 resin (65 g) was then added over one hour, while keeping the reaction temperature below 30° C. The reaction mixture was stirred for one hour. The Amberlyst® 21 resin was filtered. Glacial acetic acid (2 ml) was added and stirred for one hour. The final solution was filtered. The solid was added to a mixture of deionized (DI) water (800 ml) and methanol (200 ml), maintained at 15–20° C., while stirring. The slurry was stirred for 30 minutes and filtered. The product was dried and washed with DI water until the conductivity of the wash liquor was less than 1 $\mu$S. The compound was dried in a vacuum oven at 35–40° C. until the water content was less than 1%. The degree of esterification was determined by high pressure liquid chromatography to be 27%.

Example 4

A mixture of trihydroxybenzophenone (13.5 g, 0.054 moles), 2,1,4-diazo naphthoquinone sulfonyl chloride (39.3 g, 0.14 moles), 2,1,5-diazo naphthoquinone sulfonyl chloride (4.3 g, 0.016 moles), gamma-butyrolactone (300 ml) was stirred gently at 25° C. until about 90% of the starting materials were in solution. To this mixture was added, over 15 minutes, a solution of N-methyl morpholine (3.5 g, 0.035 moles and 0.22 equivalent of chloride) and gamma-butyrolactone (60 ml). A cleaned Amberlyst® 21 resin (80 g)

was then added over one hour, while keeping the reaction temperature below 30° C. The reaction mixture was stirred for one hour. The Amberlyst® 21 resin was filtered. Glacial acetic acid (2 ml) was added and stirred for one hour. The final solution was filtered. The solid was added to a mixture of deionized (DI) water (600 ml) and methanol (120 ml), maintained at 15–20° C., while stirring. The slurry was stirred for 30 minutes and filtered. The product was dried and washed with DI water until the conductivity of the wash liquor was less than 1 μS. The compound was dried in a vacuum oven at 35–40° C. until the water content was less than 1%. The degree of esterification was determined by high pressure liquid chromatography to be 97% and the total chloride level as measured by silver nitrate assay was 17 ppm.

Example 5 (Comparative)

A mixture of trihydroxybenzophenone (12.5 g, 0.054 moles), 2,1,4-diazo naphthoquinone sulfonyl chloride (39.3 g, 0.14 moles), 2,1,5-diazo naphthoquinone sulfonyl chloride (4.3 g, 0.016 moles), gamma-butyrolactone (300 ml) was stirred gently at 25° C. until about 90% of the starting materials were in solution. To this mixture was added, over 15 minutes, a solution of N-methyl morpholine (18 g, 0.18 moles) and gamma-butyrolactone (60 ml). The mixture was stirred for an hour and the temperature maintained at 30° C. Glacial acetic acid (4 ml) was added and stirred for one hour. The final solution was filtered. The solid was added to a mixture of deionized (DI) water (600 ml) and methanol (600 ml), maintained at 15–20° C., while stirring. The slurry was stirred for 30 minutes and filtered. The product was dried and washed with DI water until the conductivity of the wash liquor was less than 1 μS. The compound was dried in a vacuum oven at 35–40° C. until the water content was less than 1%. The degree of esterification was determined by high pressure liquid chromatography found to be 97% and the total chloride level as measured by silver nitrate assay was 100 ppm.

Example 6

A mixture of paracresol/formaldehyde resin (72 g, 0.1 moles), 2,1,5-diazo naphthoquinone sulfonyl chloride (64.6 g, 0.24 moles) and acetone (500 ml) was stirred gently at 25° C. until about 90% of the starting materials were in solution. To this mixture was added, over 15 minutes, a solution of triethylamine (2.6 g, 0.026 moles) and acetone (500 ml). A washed Amberlyst® 21 resin (80 g) was then added over one hour, while keeping the reaction temperature below 30° C. The reaction mixture was stirred for one hour. The Amberlyst® 21 resin was filtered. Glacial acetic acid (2 ml) was added and stirred for one hour. The final solution was filtered. The solid was added to a mixture of deionized (DI) water (2400 ml) and methanol (600 ml), maintained at 15–20° C., while stirring. The slurry was stirred for 30 minutes and filtered. The product was dried and washed with DI water until the conductivity of the wash liquor was less than 1 μS. The compound was dried in a vacuum oven at 35–40° C. until the water content was less than 1.0%. The resin was found to be esterified by high pressure liquid chromatography and the total chloride level as measured by silver nitrate assay was 70 ppm.

Example 7 (Comparative)

A mixture of paracresol/formaldehyde resin (25% solids) (225 g acetone and 75 g, 0.1 mole resin), 2,1,5-diazo naphthoquinone sulfonyl chloride (64.6 g, 0.24 moles) and acetone (500 ml) was stirred gently at 25° C. until about 90% of the starting materials were in solution. To this mixture was added, over 15 minutes, a solution of triethylamine (26.0 g, 0.257 moles) and acetone (50 ml). The mixture was stirred for an hour and the temperature was maintained at 30° C. Glacial acetic acid (4 ml) was added and stirred for one hour. The final solution was filtered. The solid was added to a mixture of deionized (DI) water (1200 ml) and methanol (250 ml), maintained at 15–20° C., while stirring. The slurry was stirred for 30 minutes and filtered. The product was dried and washed with DI water until the conductivity of the wash liquor was less than 1 μS. The compound was dried in a vacuum oven at 35–40° C. until the water content was less than 1%. The resin was found to be esterified by high pressure liquid chromatography with a similar degree of esterification as Example 6 and the total chloride level as measured by silver nitrate assay was 5000 ppm.

Example 8

A mixture of paracresol/formaldehyde resin (300 g of a 25% solution in acetone) and 2,1,5-diazo naphthoquinone sulfonyl chloride (64.6 g, 0.24 mole) was stirred gently at 25° C. until about 90% of the starting materials were in solution. To this mixture was added, over 15 minutes, a solution of triethylamine (2.6 g, 0.026 mole and 0.1 equivalent of chloride) and acetone (50 ml). A washed Amberlyst® 21 resin (80 g) was then added over one hour, while keeping the reaction temperature below 30° C. The reaction mixture was stirred for one hour. The Amberlyst® 21 resin was filtered. Half the solution was passed through a 200 ml prewashed Amberlyst® 15 column which had been conditioned with acetone. The solution was held for 1 hour and filtered. The filtered solution was added to a mixture of deionized (DI) water (750 ml) and methanol (750 ml), maintained at 15–20° C., while stirring. The slurry was stirred for 30 minutes and filtered. The product was dried and washed with DI water until the conductivity of the wash liquor was less than 1 μS. The compound was dried in a vacuum oven at 35–40° C. until the water content was less than 1.0%. The resin was found to be esterified by high pressure liquid chromatography and the total chloride level as measured by silver nitrate assay was 11 ppm.

Example 9

A solution of photoresist was made with 23.4 weight % cresol/formaldehyde resin, 5.9 weight % pyrogallol/acetone resin, 6.4 weight % photoactive compound from Example 6, 0.0086 weight % of FC430 (available from 3M Co., 3M Center Building 233, St. Paul, Minn. 55144) and 64.3 weight % of ethyl lactate.

The photoresist was spin coated onto silicon wafers and soft-baked at 100° C. for 90 seconds to give a film thickness of 1.2 micrometers. The samples were image-wise exposed with a G-Line stepper and post-exposure baked at 100° C. for 90 seconds. The samples were developed with AZ® MIF-32 developer (available from AZ® Electronic Materials, Clariant Corp., 70 Meister Ave., Somerville, N.J. 08876) using a 87 seconds spray/puddle 21.6° C. cycle. Good quality images were obtained on the wafers.

I claim:

1. A process for producing a photoactive ester compound of high purity by an esterification reaction comprising:
   a) reacting a hydroxy compound with a halide compound, in the presence of a solid basic catalyst and a solvent composition, where the solid basic catalyst is insoluble in the solvent composition;

b) removing the solid basic catalyst; and, c) isolating the ester compound.

2. The process according to claim 1, further comprising adding in step a) less than one equivalent of an organic amine relative to the halide compound and wherein the organic amine is soluble in the solvent composition.

3. The process according to claim 2, where the organic amine is added at a concentration of less than 0.3 equivalent relative to the halide compound.

4. The process according to claim 2, where the amine is added at a concentration of less than 0.2 equivalent relative to the halide compound.

5. The process according to claim 2, where the amine is selected from 1,4 diazabicyclo [2,2,2] octane, N-methyl morpholine, triethyl amine and diethanolamine.

6. The process according to claim 1, where the solid basic catalyst is an anionic exchange resin.

7. The process according to claim 6, where the anionic exchange resin is cleaned to remove impurities prior to using it as a catalyst.

8. The process according to claim 1, where the solid basic catalyst is removed by filtration at the end of the esterification reaction.

9. The process according to claim 1, where the compound containing a halide is selected from 2,1,4 diazonaphthoquinone sulfonylchloride, 2,1,5 diazonaphthoquinone sulfonylchloride, 2,1,6 diazonaphthoquinone sulfonylchloride, 3-diazo, 2,4-quinolinedione sulfonyl chloride, 3-diazo, 2,4-quinolinedione carboxyl chloride, 3-diazo,4-oxo coumarin sulfonyl chloride, 3-diazo,4-oxo coumarin carboxyl chloride and mixtures thereof.

10. The process according to claim 1, where the hydroxy containing compound is selected from a phenolic compound and hydroxy aliphatic compound.

11. The process according to claim 10, where the phenolic compound is a multihydroxy phenolic compound.

12. The process according to claim 11, where the multihydroxyphenolic compound is selected from oligomeric phenolic formaldehyde resins, multihydroxybenzophenones, multihydroxyphenyl alkanes, cumyl phenones and alkylphenones.

13. The process according to claim 1, where the solvent composition is selected from acetone, butyrolactone, propylene glycol monomethyl ether, dioxane, tetrahydrofuran and mixtures thereof.

14. The process according to claim 1, where the isolation step comprises precipitating, washing and drying the ester.

15. The process according to claim 1, where a cationic exchange resin is added after removing the solid catalyst and subsequently removed by filtration.

16. The process according to claim 1, where the photoactive compound has a level of chloride less than 100 ppm.

17. The process according to claim 2, where the photoactive ester compound has a level of esterification greater than 60%.

* * * * *